US012609700B2

(12) United States Patent
    Takanashi

(10) Patent No.: US 12,609,700 B2
(45) Date of Patent: Apr. 21, 2026

(54) SEMICONDUCTOR INTEGRATED CIRCUIT INCLUDING MOS SWITCH

(71) Applicant: ROHM Co., LTD., Kyoto (JP)

(72) Inventor: Koichi Takanashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 15 days.

(21) Appl. No.: 18/732,804

(22) Filed: Jun. 4, 2024

(65) Prior Publication Data

US 2024/0405775 A1 Dec. 5, 2024

(30) Foreign Application Priority Data

Jun. 5, 2023 (JP) ................................. 2023-092715

(51) Int. Cl.
    *H03K 19/003* (2006.01)
    *H03K 17/10* (2006.01)
    *H10D 84/80* (2025.01)
    *H03M 1/46* (2006.01)

(52) U.S. Cl.
    CPC ..... *H03K 19/00384* (2013.01); *H03K 17/102* (2013.01); *H10D 84/811* (2025.01); *H03M 1/462* (2013.01); *H03M 1/468* (2013.01)

(58) Field of Classification Search
    CPC ........... H03K 19/00384; H03K 17/102; H03K 2217/0054; H03K 19/003; H03K 19/00369; H03K 2217/94047; H03K 17/16; H03K 17/161; H03K 17/163; H03K 17/164; H03K 17/168; H03K 17/162; H03K 19/00346; H03K 19/00361; H03K 19/00315; H10D 84/811; H10D 84/813; H03M 1/462; H03M 1/468; H03M 1/0818; H03M 1/46

See application file for complete search history.

(56) References Cited

U.S. PATENT DOCUMENTS

2011/0148473 A1* 6/2011 Wu ........................ G11C 27/024
                                                                327/94
2017/0040990 A1* 2/2017 Anand ................. H03K 17/162

FOREIGN PATENT DOCUMENTS

JP            2019096375            6/2019

* cited by examiner

*Primary Examiner* — Jung Kim
(74) *Attorney, Agent, or Firm* — CHIP Law Group

(57) ABSTRACT

Provided is a semiconductor integrated circuit including a metal-oxide-semiconductor (MOS) switch, in which the MOS switch includes a first main MOS transistor having a first polarity, a first dummy MOS transistor having the first polarity and having opposed ends each connected to a first end of the first main MOS transistor, and a switch control circuit that supplies a first voltage according to a control signal to a gate of the first main MOS transistor, supplies a second voltage opposite in phase to the first voltage to a gate of the first dummy MOS transistor, and is configured to be capable of adjusting a slew rate of each of the first voltage and the second voltage.

12 Claims, 14 Drawing Sheets

F I G . 1
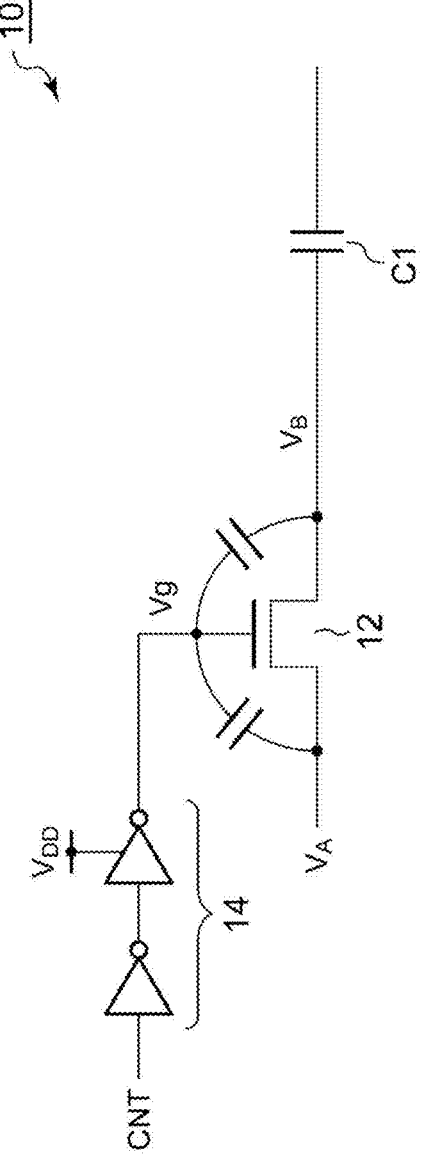

F I G . 6
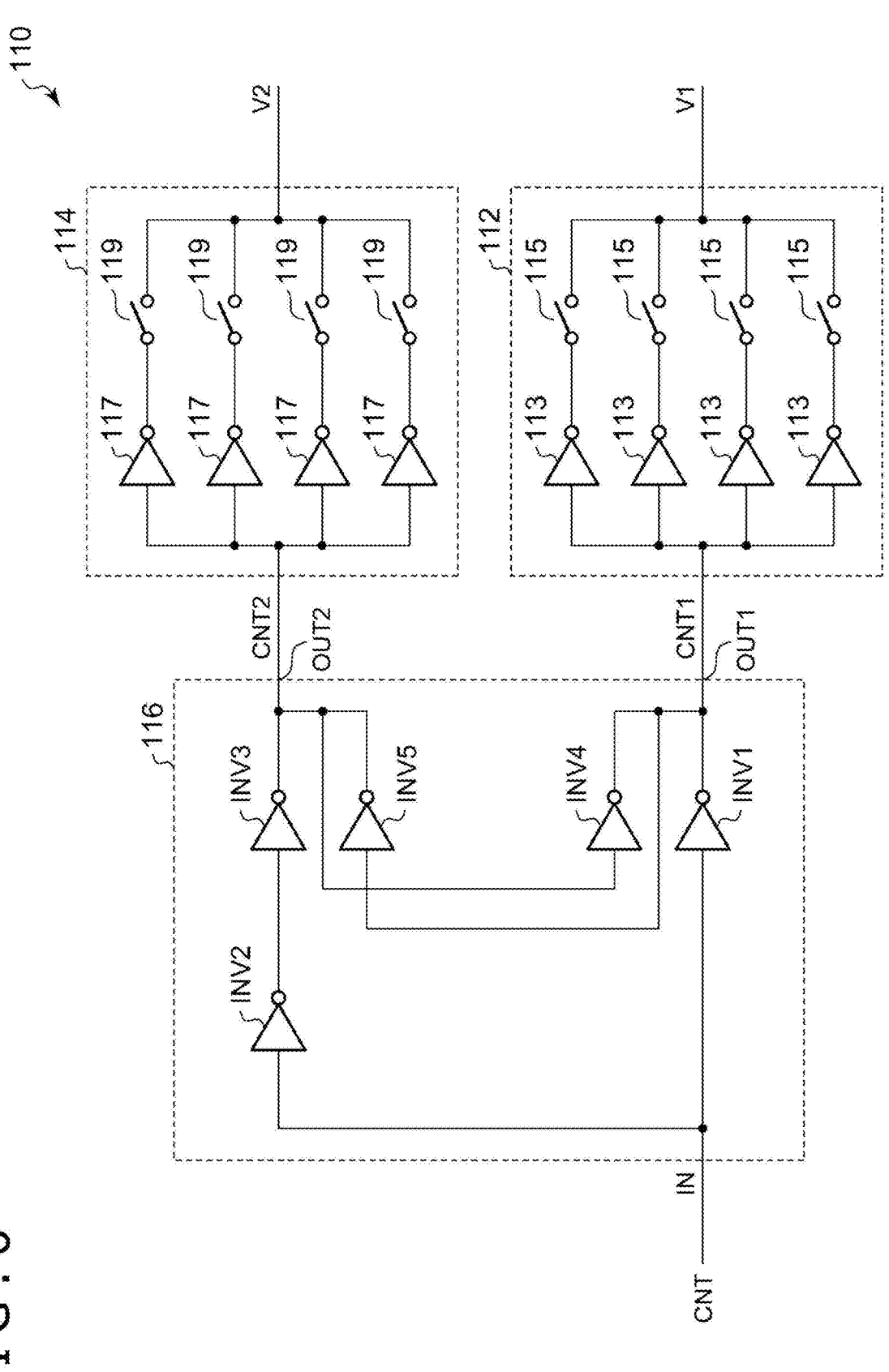

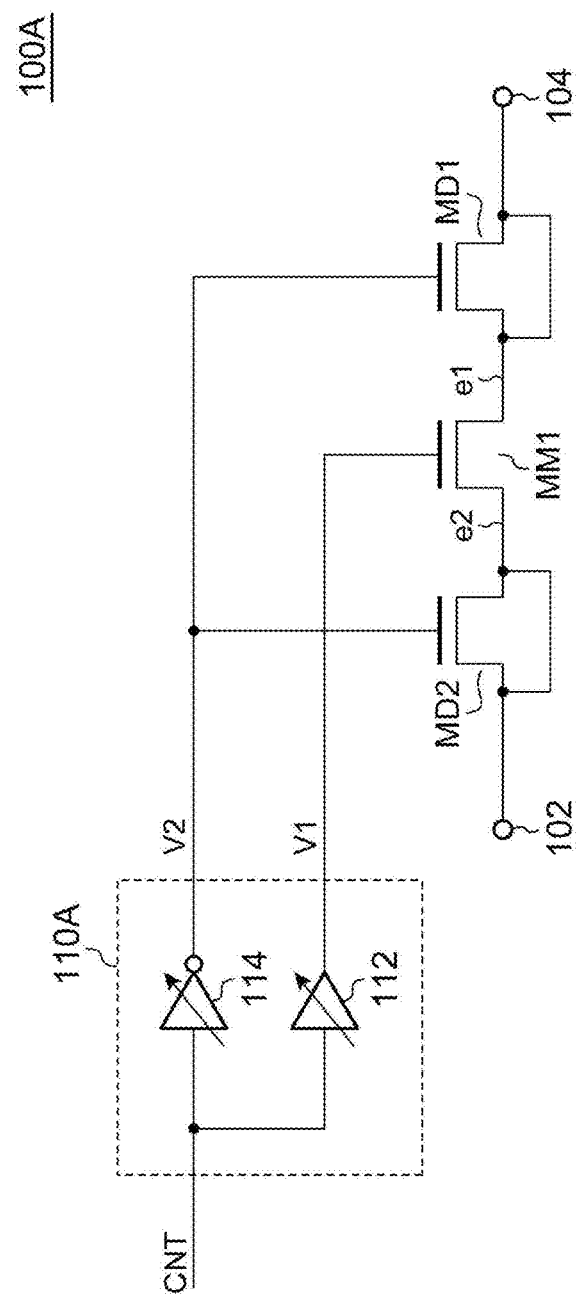
F I G . 7

F I G . 8
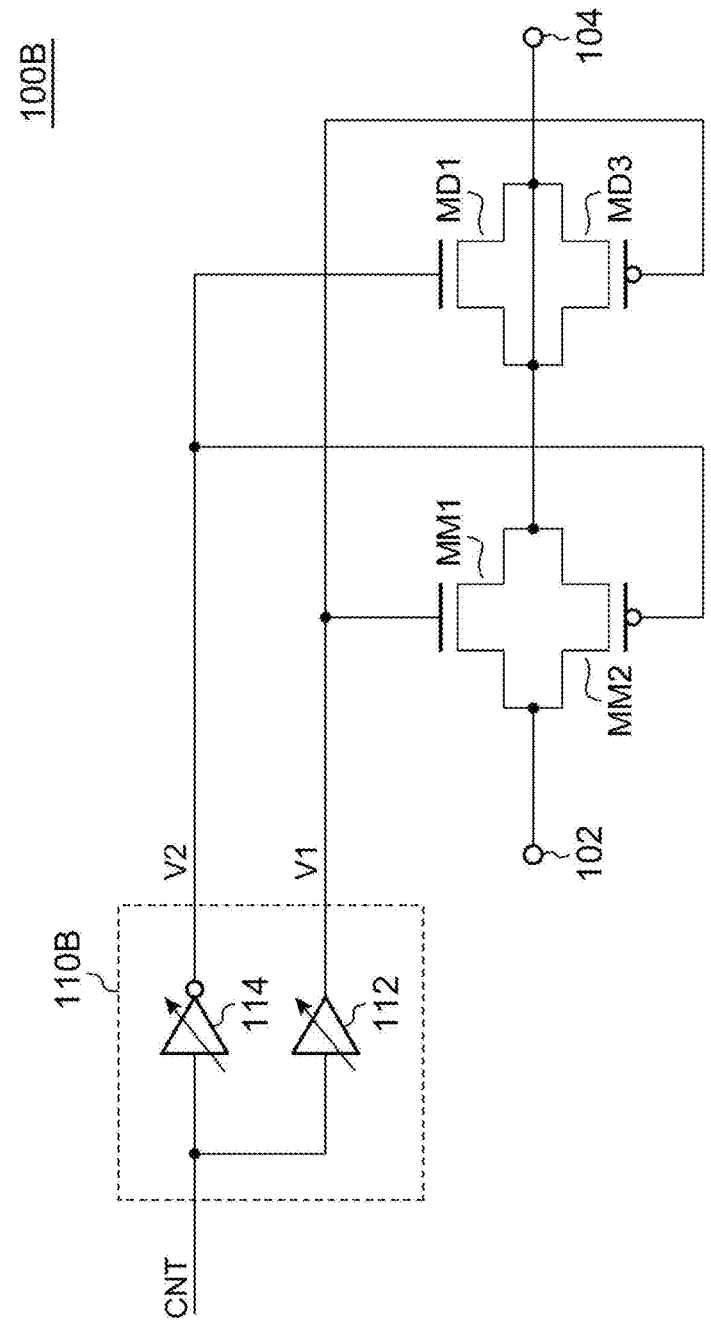

F I G . 1 0
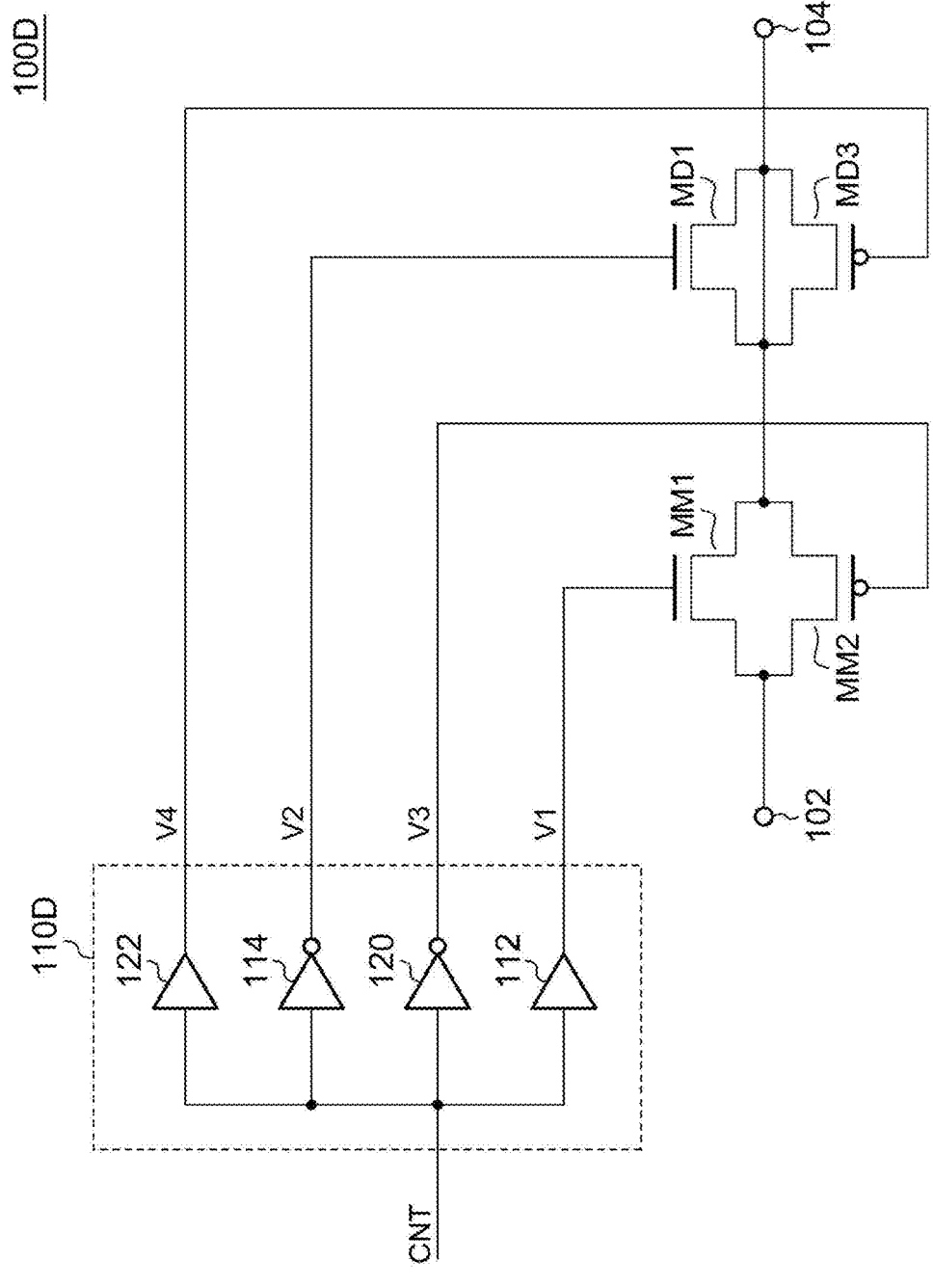

300a 204 (100)

302

202

200

300b

210

214 (100)

212

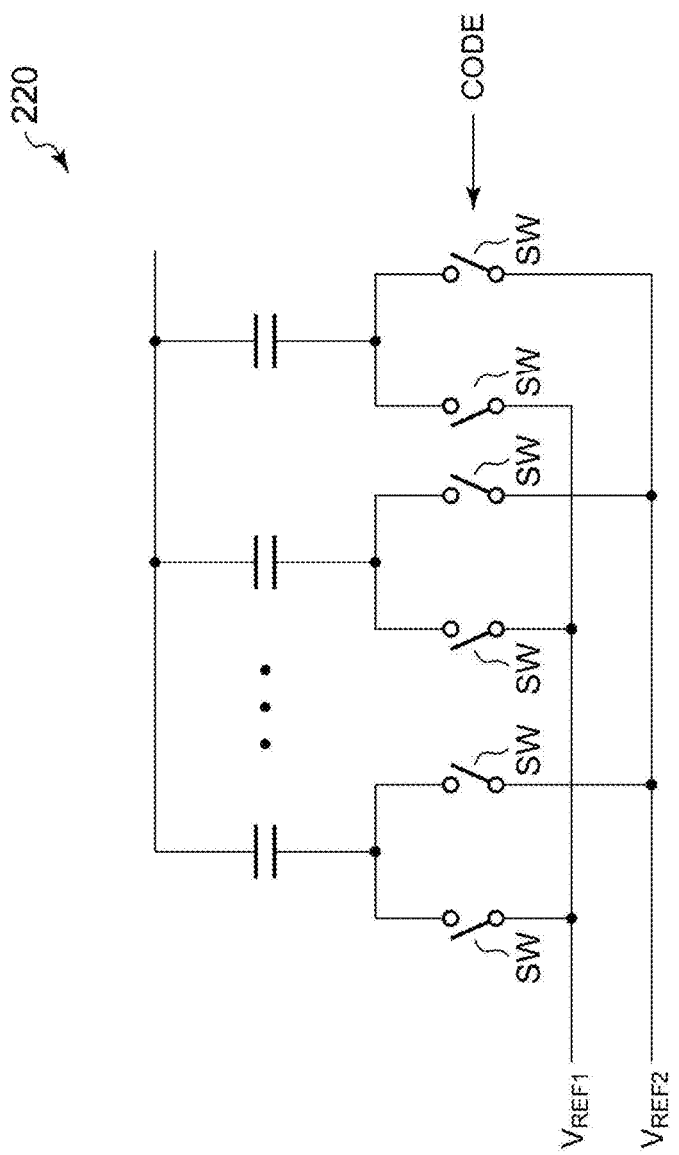
F I G . 1 5

SEMICONDUCTOR INTEGRATED CIRCUIT INCLUDING MOS SWITCH

CROSS REFERENCE TO RELATED APPLICATIONS

This application claims priority benefit of Japanese Patent Application No. JP 2023-092715 filed in the Japan Patent Office on Jun. 5, 2023. Each of the above-referenced applications is hereby incorporated herein by reference in its entirety.

BACKGROUND

The present disclosure relates to a semiconductor integrated circuit including a metal-oxide-semiconductor (MOS) switch.

As an analog-to-digital converter (ADC) having a medium to high resolution (for example, eight bits or more), a successive approximation register (SAR) ADC is often used. In the SAR-ADC, an input voltage is sampled and held, and the input voltage is compared with a first threshold voltage. Then, a second threshold voltage is determined in accordance with the result of the comparison, and a second comparison is performed. With repetition of this operation, the analog voltage is converted into a digital signal through binary search.

An example of the related art is disclosed in Japanese Patent Laid-open No. 2019-96375.

BRIEF DESCRIPTION OF THE DRAWINGS

FIG. 1 is a circuit diagram of a semiconductor integrated circuit according to a comparative technique;

FIG. 6 is a circuit diagram illustrating an example structure of a switch control circuit;

FIG. 7 is a circuit diagram of a MOS switch according to a first modification;

FIG. 8 is a circuit diagram of a MOS switch according to a second modification;

FIG. 10 is a circuit diagram of a MOS switch according to a fourth modification;

FIG. 15 is a circuit diagram of a semiconductor integrated circuit including a switched capacitor circuit.

DETAILED DESCRIPTION

Outlines of Embodiments

Figure 2:
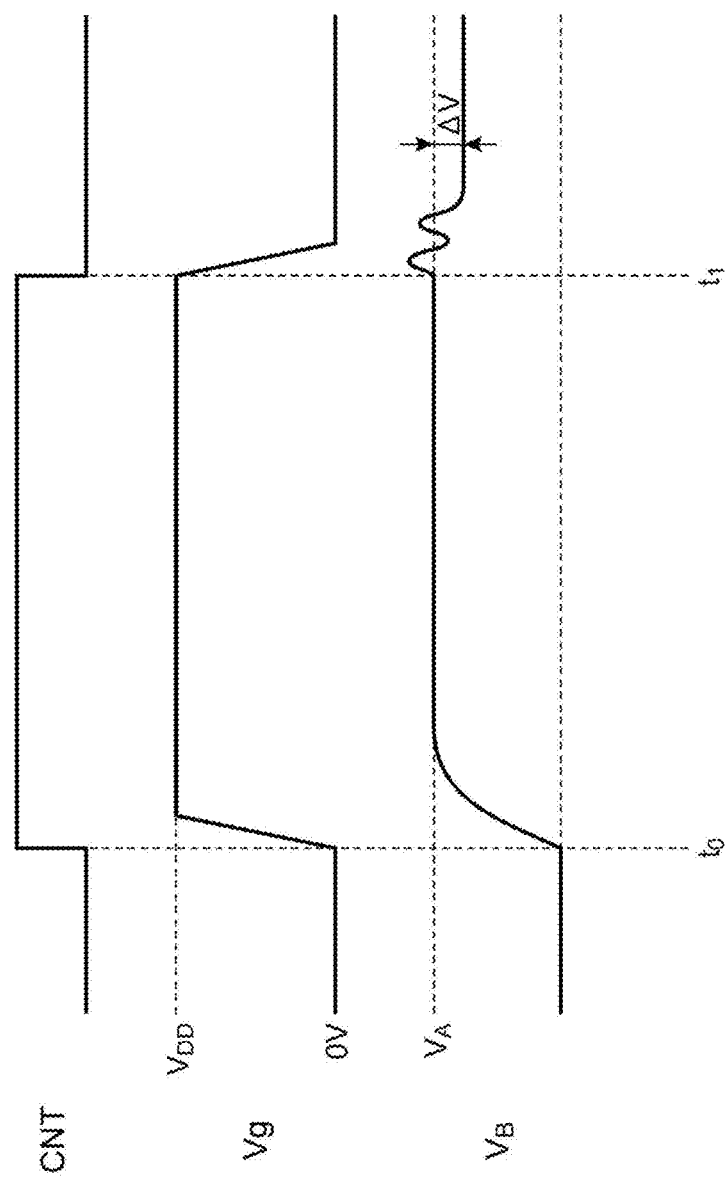
FIG. 2 is a diagram for explaining an operation of an NMOS switch in FIG. 1.

Outlines of several exemplary embodiments of the present disclosure will be described below. These outlines are described, as an introduction to the detailed description provided below, to facilitate a basic understanding of the embodiments by describing several concepts of one or more embodiments in a simplified form, and are not meant to limit the scope of the disclosure. These outlines are not comprehensive outlines of all conceivable embodiments, and are not meant to specify important elements of all embodiments or to delineate the scope of some or all of the embodiments. For the sake of convenience, the term "one embodiment" may sometimes be used to refer to one or more embodiments (example embodiments or modifications) disclosed herein.

A semiconductor integrated circuit according to one embodiment includes a metal-oxide-semiconductor (MOS) switch. The MOS switch includes: a first main MOS transistor having a first polarity; a first dummy MOS transistor having the first polarity and having opposed ends each connected to a first end of the first main MOS transistor; and a switch control circuit that supplies a first voltage according to a control signal to a gate of the first main MOS transistor, supplies a second voltage opposite in phase to the first voltage to a gate of the first dummy MOS transistor, and is configured to be capable of adjusting a slew rate of each of the first voltage and the second voltage.

This configuration makes it possible to reduce an effect of charge movement caused by clock feedthrough by optimizing the slew rate (slope) of each of the gate voltages supplied to the first main MOS transistor and the first dummy MOS transistor.

In one embodiment, the MOS switch may further include a second dummy MOS transistor having the first polarity and having opposed ends each connected to a second end of the first main MOS transistor. The switch control circuit may supply the second voltage to a gate of the second dummy MOS transistor.

In one embodiment, the MOS switch may further include a second main MOS transistor having a second polarity and connected in parallel with the first main MOS transistor, and a third dummy MOS transistor having the second polarity and connected in parallel with the first dummy MOS transistor. The switch control circuit may supply the second voltage to a gate of the second main MOS transistor and supply the first voltage to a gate of the third dummy MOS transistor.

In one embodiment, the MOS switch may further include a second dummy MOS transistor having the second polarity and having opposed ends each connected to a second end of the first main MOS transistor, and a fourth dummy MOS transistor having the second polarity and connected in parallel with the second dummy MOS transistor. The switch control circuit may supply the second voltage to a gate of the second dummy MOS transistor and supply the first voltage to a gate of the fourth dummy MOS transistor.

In one embodiment, the MOS switch may further include a second main MOS transistor having a second polarity and connected in parallel with the first main MOS transistor, and a third dummy MOS transistor having the second polarity and connected in parallel with the first dummy MOS transistor. The switch control circuit may supply a third voltage in phase with the second voltage to a gate of the second main MOS transistor, supply a fourth voltage in phase with the first voltage to a gate of the third dummy MOS transistor, and is configured to be capable of adjusting a slew rate of each of the third voltage and the fourth voltage.

In one embodiment, the MOS switch may further include a second dummy MOS transistor having the second polarity and having opposed ends each connected to a second end of the first main MOS transistor, and a fourth dummy MOS transistor having the second polarity and connected in parallel with the second dummy MOS transistor. The switch control circuit may supply the second voltage to a gate of the second dummy MOS transistor and supply the fourth voltage to a gate of the fourth dummy MOS transistor.

In one embodiment, the switch control circuit may include a logic circuit that generates a first control signal and a second control signal complementary to each other in accordance with the control signal, a first driver that generates the first voltage on the basis of the first control signal, and a second driver that generates the second voltage on the basis of the second control signal. Each of the first driver and the second driver may be configured to be controllable in capability.

In one embodiment, the first driver may include a plurality of first inverter elements connected in parallel and each capable of being switched between an enabled state and a disabled state independently. The second driver may include a plurality of second inverter elements connected in parallel and each capable of being switched between an enabled state and a disabled state independently.

In one embodiment, the logic circuit may be configured to cause the first control signal and the second control signal to make substantially concurrent transition.

In one embodiment, the logic circuit may include: an input node that receives the control signal; a first output node that produces the first control signal; a second output node that produces the second control signal; a first inverter having an input connected to the input node, and an output connected to the first output node; a second inverter having an input connected to the input node; a third inverter having an input connected to an output of the second inverter, and an output connected to the second output node; a fourth inverter having an input connected to the second output node, and an output connected to the first output node; and a fifth inverter having an input connected to the first output node, and an output connected to the second output node.

In one embodiment, the semiconductor integrated circuit may include a chopper comparator circuit. The chopper comparator circuit may include an inverter and a switch connected between an input and an output of the inverter. The switch may be any of the MOS switches described above.

In one embodiment, the semiconductor integrated circuit may include a switched capacitor circuit. The switched capacitor circuit may include a capacitor and a switch connected to the capacitor. The switch may be any of the MOS switches described above.

In one embodiment, the semiconductor integrated circuit may include a sample and hold circuit. The sample and hold circuit may include a capacitor and a switch connected to the capacitor. The switch may be any of the MOS switches described above.

EMBODIMENTS

A state where part A is connected with part B in the present specification may include a case in which part A and part B are physically directly connected with each other or a case in which part A and part B are indirectly connected with each other with another part intervening therebetween, which neither significantly affects electrical connection therebetween nor impairs a function or effect accomplished by the connection therebetween.

Similarly, a state where part C is connected (provided) between part A and part B may include a case in which part A and part C or part B and part C are directly connected with each other or a case in which part A and part C or part B and part C are indirectly connected with each other with another part intervening therebetween, which neither significantly affects electrical connection therebetween nor impairs a function or effect accomplished by the connection therebetween.

First, effects of clock feedthrough and charge injection on a MOS switch will now be described below.

FIG. 1 is a circuit diagram of a semiconductor integrated circuit 10 according to a comparative technique. The semiconductor integrated circuit 10 includes an NMOS switch 12, a capacitor C1, and a driver circuit 14. A constant voltage VA is applied to a first end of the NMOS switch 12 to make the first end a low impedance node. A second end of the NMOS switch 12 is connected to the capacitor C1 to be made a high impedance node. The driver circuit 14 supplies a gate voltage Vg according to a control signal CNT to a gate of the NMOS switch 12.

FIG. 2 is a diagram for explaining an operation of the NMOS switch 12 in FIG. 1. Prior to time to, the control signal CNT is at a low level, the gate voltage Vg of the NMOS switch 12 is 0 V, and the NMOS switch 12 is in an OFF state. Once the control signal CNT transitions to a high level at time to, the gate voltage Vg of the NMOS switch 12 is increased to a power supply voltage $V_{DD}$, and the NMOS switch 12 is turned on. Once the NMOS switch 12 is turned on, a voltage VB at the second end of the NMOS switch 12 becomes equal to the voltage VA at the first end.

Once the control signal CNT transitions to the low level at time $t_1$, the gate voltage Vg of the NMOS switch 12 is reduced to 0 V, and the NMOS switch 12 is turned off. In an ideal switch, the voltage VB at the second end would be maintained at a voltage level equal to that of the voltage VA after the turn-off. However, in the actual NMOS switch 12, charge movement is caused by clock feedthrough, resulting in the voltage VB at the second end differing from the voltage VA. This voltage error ΔV will cause a problem in various circuits involving use of a MOS switch.

The above is a problem that occurs in a MOS switch. Hereinafter, a technique to overcome such a problem will be described.

Figure 3:
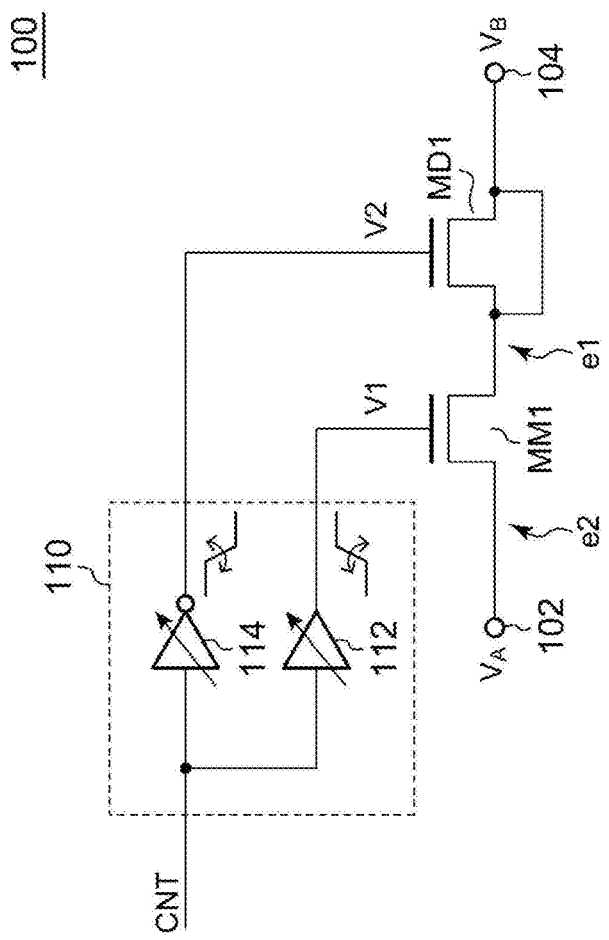
FIG. 3 is a circuit diagram of a MOS switch according to an embodiment of the present disclosure.

FIG. 3 is a circuit diagram of a MOS switch 100 according to an embodiment of the present disclosure. The MOS switch 100 includes a first main transistor MM1, a first dummy transistor MD1, and a switch control circuit 110. The MOS switch 100 is formed in a semiconductor integrated circuit. Nodes 102 and 104 are an input and an output of the MOS switch 100.

The first main transistor MM1 is a MOSFET having a first polarity. In the present embodiment, the first polarity is an N-channel, and the MOS switch 100 is an NMOS switch. A first end e1 of the first main transistor MM1 is connected to the node 104, while a second end e2 of the first main transistor MM1 is connected to the node 102.

The first dummy transistor MD1 is a MOSFET having the first polarity as is the case with the first main transistor MM1, and opposed ends of the first dummy transistor MD1 are both connected to the first end e1 of the first main transistor MM1.

The switch control circuit 110 supplies a first voltage V1 according to a control signal CNT to a gate of the first main transistor MM1, and supplies a second voltage V2 opposite in phase to the first voltage V1 to a gate of the first dummy transistor MD1. The switch control circuit 110 is configured to be capable of adjusting the slew rate of each of the first voltage V1 and the second voltage V2.

The switch control circuit 110 may include a first driver 112 that outputs the first voltage V1, and a second driver 114 that outputs the second voltage V2. Each of the first driver 112 and the second driver 114 is configured to be capable of varying in current supply capability (output impedance).

Figure 4:
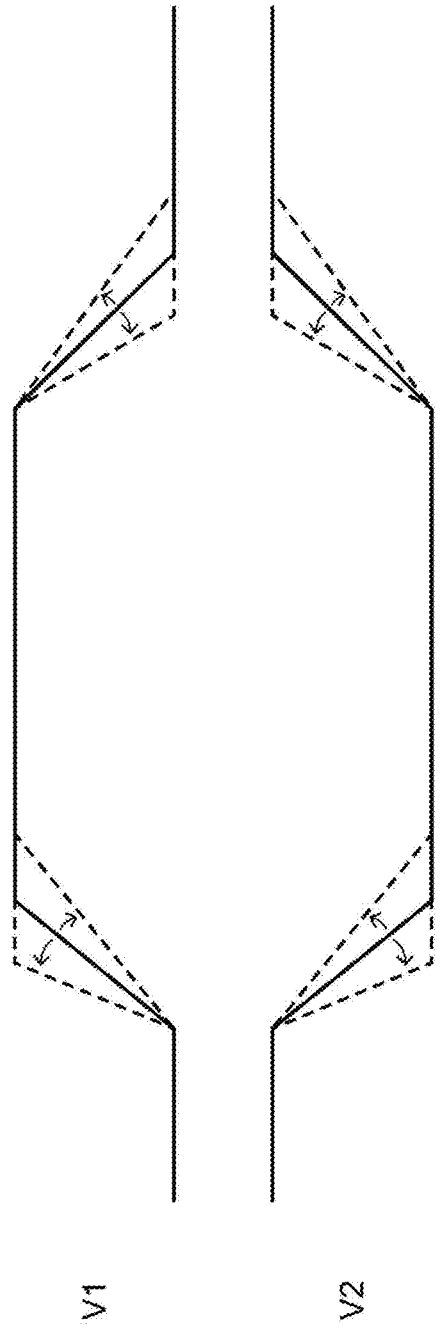
FIG. 4 is a diagram for explaining the slew rate of each of a first voltage and a second voltage.

FIG. 4 is a diagram for explaining the slew rate of each of the first voltage V1 and the second voltage V2. An increase in the current supply capability of the first driver 112 leads to an increase in the slew rate of the first voltage V1, while a reduction in the current supply capability of the first driver 112 leads to a reduction in the slew rate of the first voltage V1. The same is true of the second voltage V2.

The structure of the MOS switch 100 has been described above. Next, an operation of the MOS switch 100 will now be described below.

Figure 5:
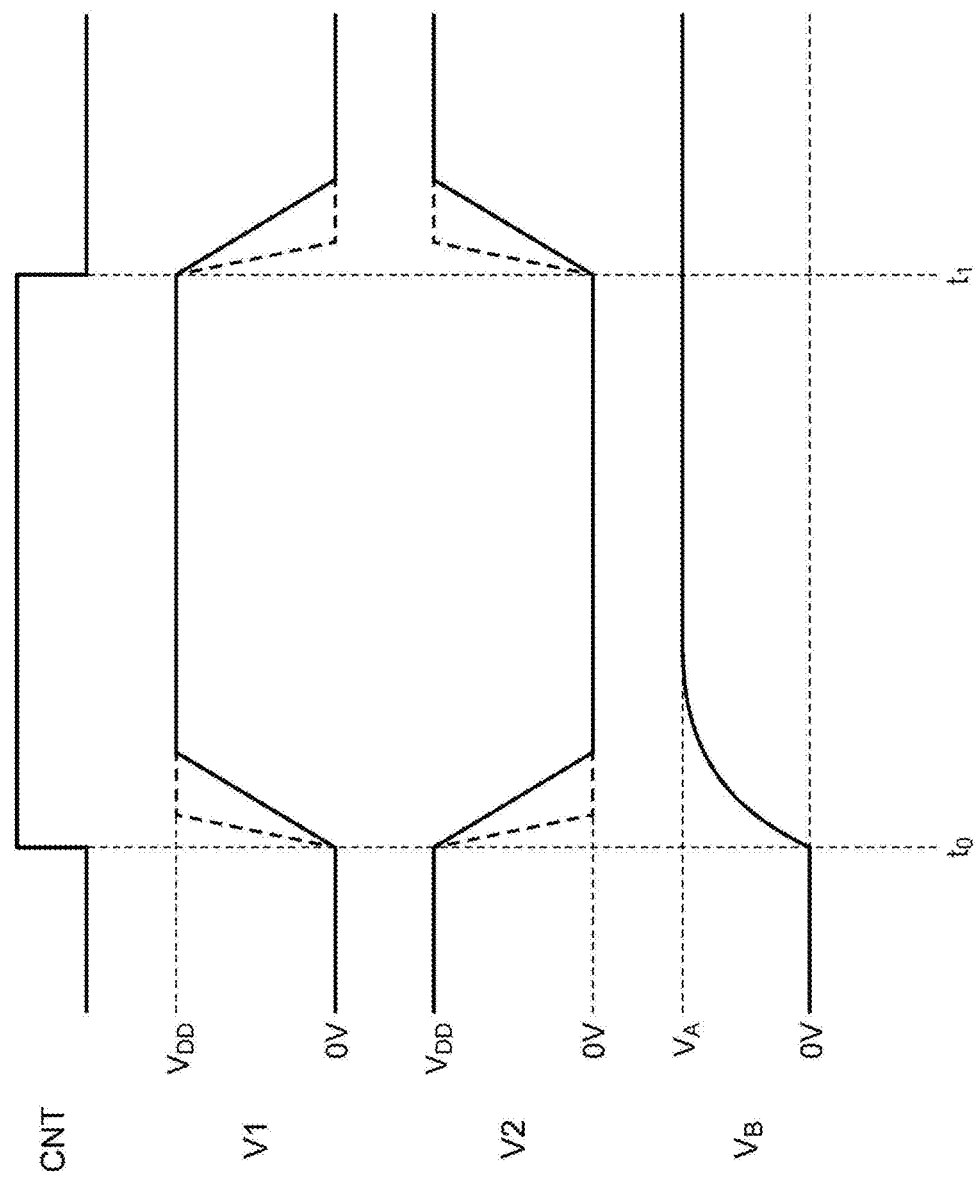
FIG. 5 is an operation waveform chart of the MOS switch in FIG. 3.

FIG. 5 is an operation waveform chart of the MOS switch 100 in FIG. 3. It is assumed that a constant voltage VA is applied to the node 102 of the MOS switch 100 and the node 104 is a high impedance node as in the case of FIG. 1.

Prior to time t0, the control signal CNT is at a low level, the first voltage V1, which is a gate voltage of the first main transistor MM1, is 0 V, and the first main transistor MM1 is in an OFF state. The second voltage V2, which is a gate voltage of the first dummy transistor MD1, is equal to the power supply voltage $V_{DD}$.

Once the control signal CNT transitions to a high level at time t0, the first voltage V1 is increased to the power supply voltage $V_{DD}$, and the first main transistor MM1 is turned on. Conversely, the second voltage V2, which is supplied to the gate of the first dummy transistor MD1, is reduced to 0 V. Once the first main transistor MM1 is turned on, the voltage VB at the node 104 of the MOS switch 100 becomes equal to the voltage VA at the node 102.

Once the control signal CNT transitions to the low level at time $t_1$, the first voltage V1 is reduced to 0 V, and the first main transistor MM1 is turned off. At this time, an electric charge at the node 104 moves to the gate of the first main transistor MM1 through parasitic capacitance of the first main transistor MM1.

Meanwhile, the second voltage V2, which is supplied to the gate of the first dummy transistor MD1, is increased from 0 V to the power supply voltage $V_{DD}$. Accordingly, in the first dummy transistor MD1, an electric charge moves from the gate toward the node 104.

Here, the amount of electric charge that moves through parasitic capacitance in a MOSFET depends on the slew rate of the gate voltage. Specifically, an increase in the slew rate of the gate voltage leads to an increase in the amount of moving electric charge, while a reduction in the slew rate of the gate voltage leads to a reduction in the amount of moving electric charge. As described above, in this embodiment, the slew rate of each of the first voltage V1 and the second voltage V2 is adjustable. Therefore, the slew rate of each of the first voltage V1 and the second voltage V2 can be optimized to make the amount of moving electric charge in the first main transistor MM1 equal to the amount of moving electric charge in the first dummy transistor MD1, thereby making an error $\Delta V$ in the voltage at the node 104 close to zero.

Although it has been assumed here that each of the first main transistor MM1 and the first dummy transistor MD1 is an N-channel MOSFET, the technique as described above is also applicable to a PMOS switch in which a P-channel MOSFET is used as a first main transistor MM1 and a first dummy transistor MD1.

FIG. 6 is a circuit diagram illustrating an example structure of the switch control circuit 110. The switch control circuit 110 includes the first driver 112, the second driver 114, and a logic circuit 116. The logic circuit 116 generates a first control signal CNT1 and a second control signal CNT2, which are complementary to each other, in accordance with the control signal CNT. The first driver 112 generates the first voltage V1 according to the first control signal CNT1, while the second driver 114 generates the second voltage V2 according to the second control signal CNT2.

The first driver 112 includes a plurality of first inverter elements 113 connected in parallel. Each of the plurality of first inverter elements 113 is capable of being switched between an enabled state and a disabled state independently. In the example structure of FIG. 6, a switch 115 is connected to an output of each first inverter element 113, and when the switch 115 is turned on, the corresponding first inverter element 113 enters the enabled state, and when the switch 115 is turned off, the corresponding first inverter element 113 enters the disabled state.

The plurality of first inverter elements 113 may have either binary weighted sizes or an equal size, for example. The current supply capability of the first driver 112, i.e. the slew rate of the first voltage V1, is controlled with the number of switches 115 that are turned on.

Similarly, the second driver 114 has a structure similar to that of the first driver 112, and includes a plurality of second inverter elements 117 connected in parallel, and a plurality of switches 119. The current supply capability of the second driver 114, i.e. the slew rate of the second voltage V2, is controlled with the number of switches 119 that are turned on.

In the simplest form, the logic circuit 116 may include only one inverter INV1. In this case, however, the first control signal CNT1 will be delayed relative to the second control signal CNT2.

The logic circuit 116 in FIG. 6 is configured to cause the first control signal CNT1 and the second control signal CNT2 to make substantially concurrent transition, i.e. to be equal in the amount of delay. The logic circuit 116 includes the first inverter INV1, a second inverter INV2, a third inverter INV3, a fourth inverter INV4, and a fifth inverter INV5.

An input of the first inverter INV1 is connected to an input node IN, and an output of the first inverter INV1 is connected to a first output node OUT1. An input of the second inverter INV2 is connected to the input node IN. An input of the third inverter INV3 is connected to an output of the second inverter INV2, and an output of the third inverter INV3 is connected to a second output node OUT2. An input of the fourth inverter INV4 is connected to the second output node OUT2, and an output of the fourth inverter INV4 is connected to the first output node OUT1. An input of the fifth inverter INV5 is connected to the first output node OUT1, and an output of the fifth inverter INV5 is connected to the second output node OUT2.

This structure enables the first control signal CNT1 and the second control signal CNT2 to be equal in the amount of delay relative to the control signal CNT.

Next, example modifications of the MOS switch 100 will now be described below.

First Modification

FIG. 7 is a circuit diagram of a MOS switch 100A according to a first modification. When compared to the MOS switch 100 in FIG. 3, the MOS switch 100A additionally includes a second dummy transistor MD2. The second dummy transistor MD2 is a MOSFET having the first polarity (i.e. the N-channel), and opposed ends of the second dummy transistor MD2 are both connected to the second end e2 of the first main transistor MM1, i.e. to the node 102.

A switch control circuit 110A supplies the second voltage V2 to a gate of the second dummy transistor MD2. This structure makes it possible to reduce fluctuation of the voltage at the node 102 in the case where the node 102 is a high impedance node.

Second Modification

FIG. 8 is a circuit diagram of a MOS switch 100B according to a second modification. The MOS switch 100B is a CMOS switch, and when compared to the MOS switch 100 in FIG. 3, the MOS switch 100B additionally includes a second main transistor MM2 and a third dummy transistor MD3.

The second main transistor MM2 is a P-channel MOSFET having a second polarity, and is connected in parallel with the first main transistor MM1.

The third dummy transistor MD3 is a P-channel MOSFET having the second polarity, and is connected in parallel with the first dummy transistor MD1. As is the case with the first dummy transistor MD1, opposed ends of the third dummy transistor MD3 are connected to each other.

A switch control circuit 110B supplies the second voltage V2 to a gate of the second main transistor MM2, and supplies the first voltage V1 to a gate of the third dummy transistor MD3.

Third Modification

Figure 9:
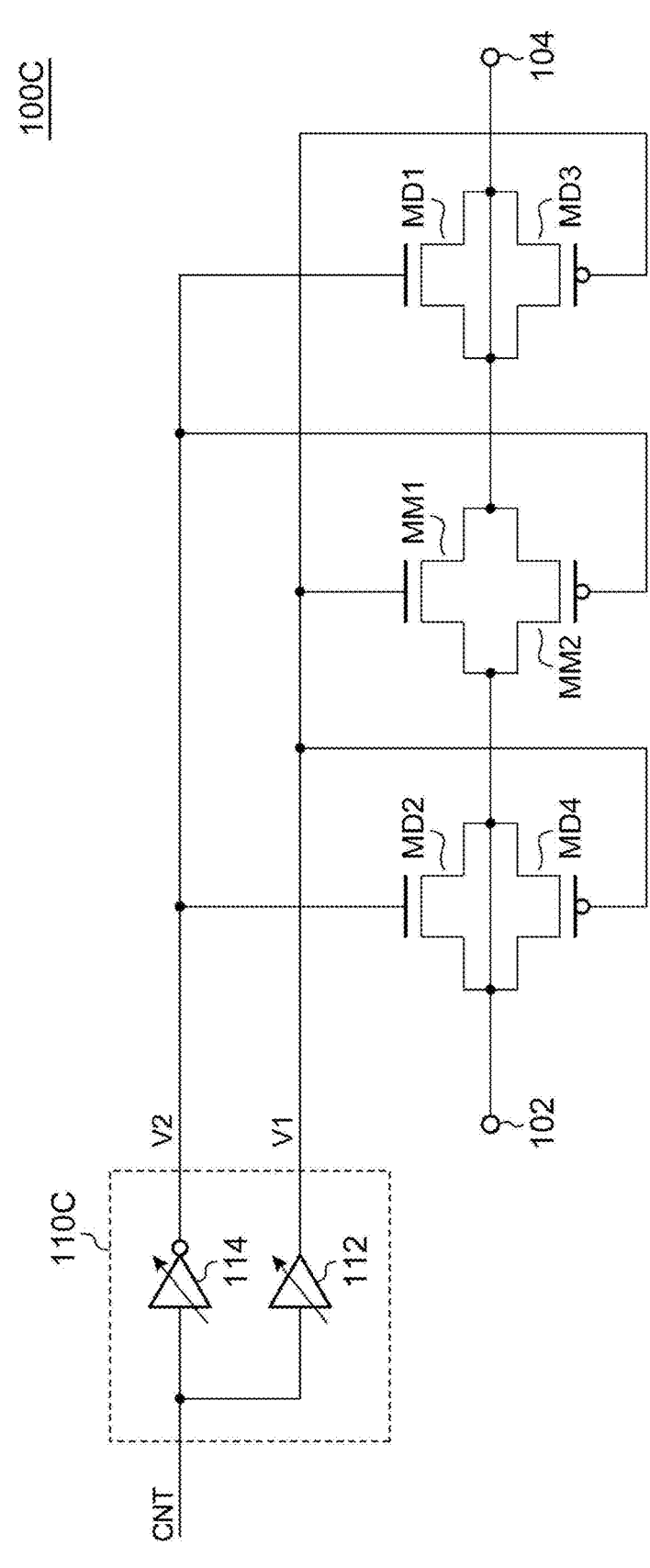
FIG. 9 is a circuit diagram of a MOS switch according to a third modification.

FIG. 9 is a circuit diagram of a MOS switch 100C according to a third modification. When compared to the MOS switch 100B in FIG. 8, the MOS switch 100C additionally includes a second dummy transistor MD2 and a fourth dummy transistor MD4.

A switch control circuit 110C supplies the second voltage V2 to a gate of the second dummy transistor MD2, and supplies the first voltage V1 to a gate of the fourth dummy transistor MD4.

Fourth Modification

FIG. 10 is a circuit diagram of a MOS switch 100D according to a fourth modification. The MOS switch 100D includes the first main transistor MM1, the second main transistor MM2, the first dummy transistor MD1, and the third dummy transistor MD3 similarly to the MOS switch 100B in FIG. 8, but is different from the MOS switch 100B in the structure of a switch control circuit 110D.

The switch control circuit 110D includes a third driver 120 and a fourth driver 122 in addition to the first driver 112 and the second driver 114. The switch control circuit 110D supplies a third voltage V3 in phase with the second voltage V2 to the gate of the second main transistor MM2, and supplies a fourth voltage V4 in phase with the first voltage V1 to the gate of the third dummy transistor MD3. The switch control circuit 110D is configured to be capable of adjusting the slew rate of each of the third voltage V3 and the fourth voltage V4.

Figure 11:
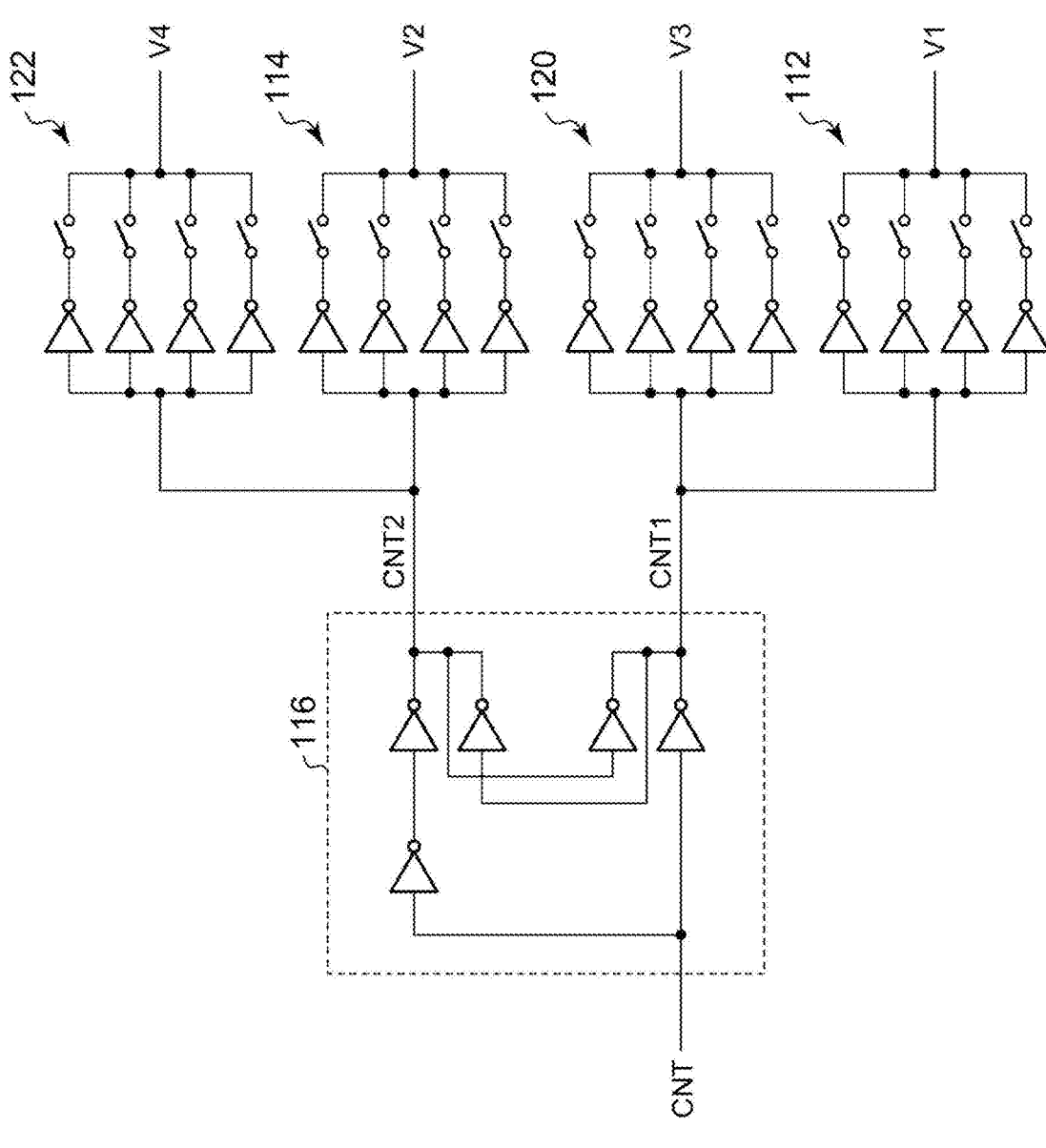
FIG. 11 is a circuit diagram illustrating an example structure of a switch control circuit.

FIG. 11 is a circuit diagram illustrating an example structure of the switch control circuit 110D. When compared to the switch control circuit 110 in FIG. 6, the switch control circuit 110D additionally includes the third driver 120 and the fourth driver 122. The third driver 120 and the fourth driver 122 may have structures similar to those of the first driver 112 and the second driver 114.

Fifth Modification

Figure 12:
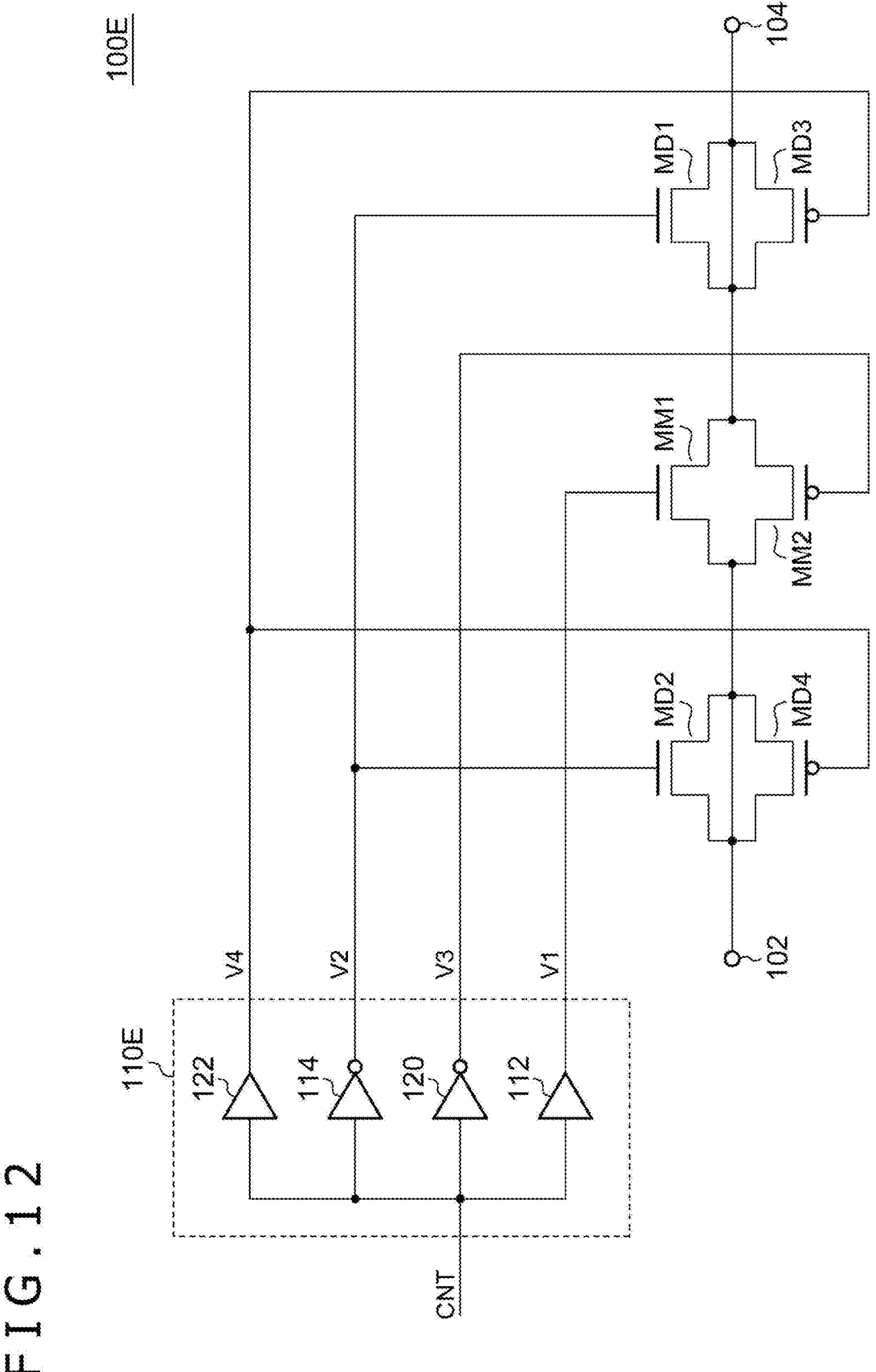
FIG. 12 is a circuit diagram of a MOS switch according to a fifth modification.

FIG. 12 is a circuit diagram of a MOS switch 100E according to a fifth modification. The MOS switch 100E additionally includes the second dummy transistor MD2 and the fourth dummy transistor MD4 similarly to the MOS switch 100C in FIG. 9.

A switch control circuit 110E supplies the second voltage V2 to the gate of the second dummy transistor MD2, and supplies the fourth voltage V4 to the gate of the fourth dummy transistor MD4.

Uses

Next, uses of the MOS switches (including the modifications) will now be described below.

Figure 13:
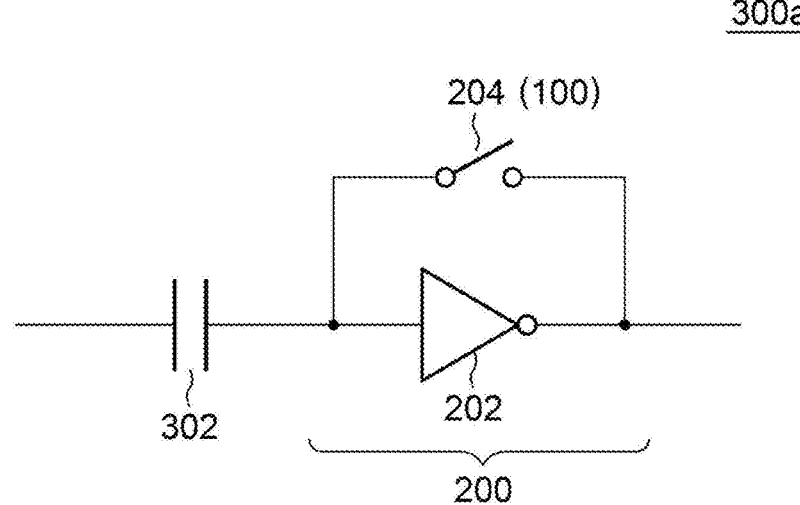
FIG. 13 is a circuit diagram of a semiconductor integrated circuit including a chopper comparator circuit.

FIG. 13 is a circuit diagram of a semiconductor integrated circuit 300a including a chopper comparator circuit 200. The chopper comparator circuit 200 includes an inverter 202 and a switch 204. The switch 204 is connected between an input node and an output node of the inverter 202. In a stage previous to the chopper comparator circuit 200, a capacitor 302 is connected thereto. The structure of the above-described MOS switch 100 can be adopted in the switch 204.

Figure 14:
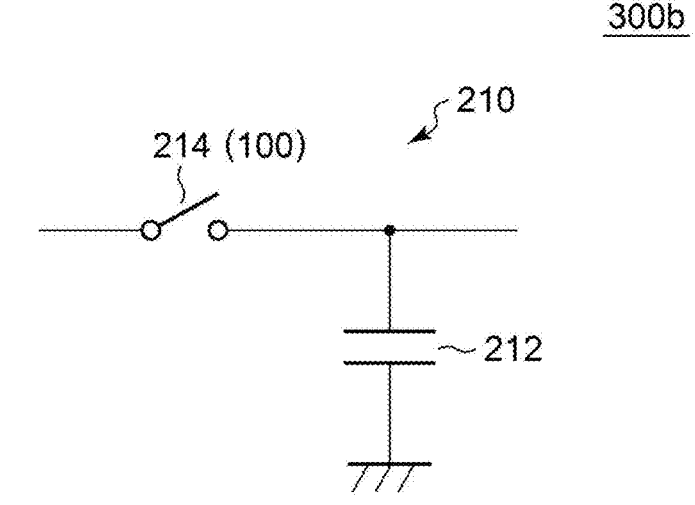
FIG. 14 is a circuit diagram of a semiconductor integrated circuit including a sample and hold circuit.

FIG. 14 is a circuit diagram of a semiconductor integrated circuit 300b including a sample and hold circuit 210. The sample and hold circuit 210 includes a capacitor 212 and a switch 214. The structure of the above-described MOS switch 100 can be adopted in the switch 214.

FIG. 15 is a circuit diagram of a semiconductor integrated circuit 300c including a switched capacitor circuit 220. In this example, the switched capacitor circuit 220 is a capacitive D/A converter. The structure of the above-described MOS switch 100 can be adopted in switches SW.

Each of the chopper comparator circuit, the sample and hold circuit, and the switched capacitor circuit (i.e. the capacitive D/A converter) illustrated in FIGS. 13 to 15 is a component of a successive-approximation A/D converter (SAR-ADC). Use of the above-described MOS switch 100 in an SAR-ADC leads to a reduction in error voltage caused by clock feedthrough, and hence to an improvement in conversion accuracy.

Additions

The following features are disclosed herein.

Item 1

A semiconductor integrated circuit including:

a metal-oxide-semiconductor (MOS) switch, in which the MOS switch includes a first main MOS transistor having a first polarity, a first dummy MOS transistor having the first polarity and having opposed ends each connected to a first end of the first main MOS transistor, and a switch control circuit that supplies a first voltage according to a control signal to a gate of the first main MOS transistor, supplies a second voltage opposite in phase to the first voltage to a gate of the first dummy MOS transistor, and is configured to be capable of adjusting a slew rate of each of the first voltage and the second voltage.

Item 2

The semiconductor integrated circuit according to Item 1, in which the MOS switch further includes a second dummy MOS transistor having the first polarity and having opposed ends each connected to a second end of the first main MOS transistor, and the switch control circuit supplies the second voltage to a gate of the second dummy MOS transistor.

Item 3

The semiconductor integrated circuit according to Item 1, in which the MOS switch further includes a second main MOS transistor having a second polarity and connected in parallel with the first main MOS transistor, and a third dummy MOS transistor having the second polarity and connected in parallel with the first dummy MOS transistor, and the switch control circuit supplies the second voltage to a gate of the second main MOS transistor, and supplies the first voltage to a gate of the third dummy MOS transistor.

Item 4

The semiconductor integrated circuit according to Item 3, in which the MOS switch further includes a second dummy MOS transistor having the second polarity and having opposed ends each connected to a second end of the first main MOS transistor, and a fourth dummy MOS transistor having the second polarity and connected in parallel with the second dummy MOS transistor, and the switch control circuit supplies the second voltage to a gate of the second dummy MOS transistor, and supplies the first voltage to a gate of the fourth dummy MOS transistor.

Item 5

The semiconductor integrated circuit according to Item 1, in which the MOS switch further includes a second main MOS transistor having a second polarity and connected in parallel with the first main MOS transistor, and a third dummy MOS transistor having the second polarity and connected in parallel with the first dummy MOS transistor, and the switch control circuit supplies a third voltage in phase with the second voltage to a gate of the second main MOS transistor, supplies a fourth voltage in phase with the first voltage to a gate of the third dummy MOS transistor, and is configured to be capable of adjusting a slew rate of each of the third voltage and the fourth voltage.

Item 6

The semiconductor integrated circuit according to Item 5, in which the MOS switch further includes a second dummy MOS transistor having the second polarity and having opposed ends each connected to a second end of the first main MOS transistor, and a fourth dummy MOS transistor having the second polarity and connected in parallel with the second dummy MOS transistor, and the switch control circuit supplies the second voltage to a gate of the second dummy MOS transistor, and supplies the fourth voltage to a gate of the fourth dummy MOS transistor.

Item 7

The semiconductor integrated circuit according to any one of Items 1 to 6, in which the switch control circuit includes a logic circuit that generates a first control signal and a second control signal complementary to each other in accordance with the control signal, a first driver that generates the first voltage on the basis of the first control signal, and a second driver that generates the second voltage on the basis of the second control signal, and each of the first driver and the second driver is configured to be controllable in capability.

Item 8

The semiconductor integrated circuit according to Item 7, in which the first driver includes a plurality of first inverter elements connected in parallel and each capable of being switched between an enabled state and a disabled state independently, and the second driver includes a plurality of second inverter elements connected in parallel and each capable of being switched between an enabled state and a disabled state independently.

Item 9

The semiconductor integrated circuit according to Item 7 or 8, in which the logic circuit causes the first control signal and the second control signal to make substantially concurrent transition.

(Item 10)

The semiconductor integrated circuit according to Item 8 or 9, in which the logic circuit includes an input node that receives the control signal, a first output node that produces the first control signal, a second output node that produces the second control signal, a first inverter having an input connected to the input node and an output connected to the first output node, a second inverter having an input connected to the input node, a third inverter having an input connected to an output of the second inverter and an output connected to the second output node, a fourth inverter having an input connected to the second output node and an output connected to the first output node, and a fifth inverter having an input connected to the first output node and an output connected to the second output node.

Item 11

The semiconductor integrated circuit according to any one of Items 1 to 10, including:

a chopper comparator circuit, in which the chopper comparator circuit includes an inverter, and a switch connected between an input and an output of the inverter, and the switch is the MOS switch.

Item 12

The semiconductor integrated circuit according to any one of Items 1 to 10, including:

a switched capacitor circuit, in which the switched capacitor circuit includes a capacitor, and a switch connected to the capacitor, and the switch is the MOS switch.

Item 13

The semiconductor integrated circuit according to any one of Items 1 to 10, including:

a sample and hold circuit, in which the sample and hold circuit includes a capacitor, and a switch connected to the capacitor, and the switch is the MOS switch.

According to an embodiment of the present disclosure, a reduction in an effect of clock feedthrough on a MOS switch can be achieved.

What is claimed is:

1. A semiconductor integrated circuit comprising:

a metal-oxide-semiconductor (MOS) switch, wherein the MOS switch includes a first main MOS transistor having a first polarity, a first dummy MOS transistor having the first polarity and having opposed ends each connected to a first end of the first main MOS transistor, a second dummy MOS transistor having the first polarity and having opposed ends each connected to a second end of the first main MOS transistor, and a switch control circuit that supplies a first voltage according to a control signal to a gate of the first main MOS transistor, supplies a second voltage opposite in phase to the first voltage to a gate of the first dummy MOS transistor, supplies the second voltage to a gate of the second dummy MOS transistor, and is configured to adjust a slew rate of each of the first voltage and the second voltage.

2. The semiconductor integrated circuit according to claim 1, wherein the MOS switch further includes a second main MOS transistor having a second polarity and connected in parallel with the first main MOS transistor, and a third dummy MOS transistor having the second polarity and connected in parallel with the first dummy MOS transistor, and the switch control circuit supplies a third voltage in phase with the second voltage to a gate of the second main MOS transistor, supplies a fourth voltage in phase with the first voltage to a gate of the third dummy MOS transistor, and is configured to adjust a slew rate of each of the third voltage and the fourth voltage.

3. The semiconductor integrated circuit according to claim 2, wherein the MOS switch further includes a fourth dummy MOS transistor having the second polarity and having opposed ends each connected to the second end of the first main MOS transistor, and a fifth dummy MOS transistor having the second polarity and connected in parallel with the fourth dummy MOS transistor, and the switch control circuit supplies the second voltage to a gate of the fourth dummy MOS transistor, and supplies the fourth voltage to a gate of the fifth dummy MOS transistor.

4. The semiconductor integrated circuit according to claim 1, wherein the switch control circuit includes a logic circuit that generates a first control signal and a second control signal, wherein the first control signal is complementary to the second control signal, in accordance with the control signal, a first driver that generates the first voltage on a basis of the first control signal, and a second driver that generates the second voltage on a basis of the second control signal, and each of the first driver and the second driver is configured to be controllable in capability.

5. The semiconductor integrated circuit according to claim 4, wherein the first driver includes a plurality of first inverter elements connected in parallel and each of which is switchable between an enabled state and a disabled state independently, and the second driver includes a plurality of second inverter elements connected in parallel and each of which is switchable between an enabled state and a disabled state independently.

6. The semiconductor integrated circuit according to claim 4, wherein the logic circuit causes the first control signal and the second control signal to make substantially concurrent transition.

7. The semiconductor integrated circuit according to claim 5, wherein the logic circuit includes an input node that receives the control signal, a first output node that produces the first control signal, a second output node that produces the second control signal, a first inverter having an input connected to the input node and an output connected to the first output node, a second inverter having an input connected to the input node, a third inverter having an input connected to an output of the second inverter and an output connected to the second output node, a fourth inverter having an input connected to the second output node and an output connected to the first output node, and a fifth inverter having an input connected to the first output node and an output connected to the second output node.

8. The semiconductor integrated circuit according to claim 1, comprising:

a chopper comparator circuit, wherein the chopper comparator circuit includes an inverter, and a switch connected between an input and an output of the inverter, wherein the switch is the MOS switch.

9. The semiconductor integrated circuit according to claim 1, comprising:

a switched capacitor circuit, wherein the switched capacitor circuit includes a capacitor, and a switch connected to the capacitor, wherein the switch is the MOS switch.

10. The semiconductor integrated circuit according to claim 1, comprising:

a sample and hold circuit, wherein the sample and hold circuit includes a capacitor, and a switch connected to the capacitor, wherein the switch is the MOS switch.

11. A semiconductor integrated circuit comprising:

a metal-oxide-semiconductor (MOS) switch, wherein the MOS switch includes a first main MOS transistor having a first polarity, a second main MOS transistor having a second polarity and connected in parallel with the first main MOS transistor, a first dummy MOS transistor having the first polarity and having opposed ends each connected to a first end of the first main MOS transistor, a second dummy MOS transistor having the second polarity and having opposed ends each connected to a second end of the first main MOS transistor, a third dummy MOS transistor having the second polarity and connected in parallel with the first dummy MOS transistor, a fourth dummy MOS transistor having the second polarity and connected in parallel with the second dummy MOS transistor, and a switch control circuit that supplies a first voltage according to a control signal to a gate of the first main MOS transistor, supplies a second voltage opposite in phase to the first voltage to a gate of the first dummy MOS transistor, supplies the second voltage to a gate of the second main MOS transistor, supplies the first voltage to a gate of the third dummy MOS transistor, supplies the second voltage to a gate of the second dummy MOS transistor, supplies the first voltage to a gate of the fourth dummy MOS transistor, and is configured to adjust a slew rate of each of the first voltage and the second voltage.

12. A semiconductor integrated circuit comprising:

a metal-oxide-semiconductor (MOS) switch, wherein the MOS switch includes a first main MOS transistor having a first polarity, a first dummy MOS transistor having the first polarity and having opposed ends each connected to a first end of the first main MOS transistor, a second main MOS transistor having a second polarity and connected in parallel with the first main MOS transistor, a second dummy MOS transistor having the second polarity and having opposed ends each connected to a second end of the first main MOS transistor, a third dummy MOS transistor having the second polarity and connected in parallel with the first dummy MOS transistor, a fourth dummy MOS transistor having the second polarity and connected in parallel with the second dummy MOS transistor, and a switch control circuit that supplies a first voltage according to a control signal to a gate of the first main MOS transistor, supplies a second voltage opposite in phase to the first voltage to a gate of the first dummy MOS transistor, supplies a third voltage in phase with the second voltage to a gate of the second main MOS transistor, supplies a fourth voltage in phase with the first voltage to a gate of the third dummy MOS transistor, supplies the second voltage to a gate of the second dummy MOS transistor, supplies the fourth voltage to a gate of the fourth dummy MOS transistor, and is configured to adjust a slew rate of each of the first voltage, the second voltage, the third voltage, and the fourth voltage.

\* \* \* \* \*